(12) United States Patent
Yotsuya

(10) Patent No.: US 6,720,236 B2
(45) Date of Patent: Apr. 13, 2004

(54) MASK AND METHOD OF MANUFACTURING THE SAME, ELECTROLUMINESCENCE DEVICE AND METHOD OF MANUFACTURING THE SAME, AND ELECTRONIC INSTRUMENT

(75) Inventor: Shinichi Yotsuya, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/247,360

(22) Filed: Sep. 20, 2002

(65) Prior Publication Data

US 2003/0061593 A1 Mar. 27, 2003

(30) Foreign Application Priority Data

Sep. 25, 2001 (JP) ........................................ 2001-292041

(51) Int. Cl.⁷ ................................................ H01L 21/46
(52) U.S. Cl. ....................... 438/455; 438/459; 438/942; 257/618; 257/706
(58) Field of Search ................................ 438/455, 459, 438/421, 411, 422, 942, 945, 950, 456; 257/706, 618, E21.211, E23.098

(56) References Cited

U.S. PATENT DOCUMENTS 6,289,695 B1 * 9/2001 Swierkowski et al. ......... 65/36

FOREIGN PATENT DOCUMENTS

WO WO92/16822 * 10/1992

OTHER PUBLICATIONS

U.S. patent application Ser. No. 10/246,731, Yotsuya, filed Sep. 19, 2002.
U.S. patent application Ser. No. 10/247,570, Yotsuya, filed Sep. 20, 2002.

* cited by examiner

Primary Examiner—Caridad Everhart
(74) Attorney, Agent, or Firm—Oliff & Berridge, PLC

(57) ABSTRACT

A method of manufacturing a mask includes: attaching a second substrate having a plurality of penetrating holes to a first substrate having an opening. The second substrate is attached such that the penetrating holes are positioned within the opening. A groove is formed on a surface of the first substrate facing the second substrate. The groove is utilized to form a flow path between the first and second substrates.

19 Claims, 9 Drawing Sheets

MASK AND METHOD OF MANUFACTURING THE SAME, ELECTRO-LUMINESCENCE DEVICE AND METHOD OF MANUFACTURING THE SAME, AND ELECTRONIC INSTRUMENT

Japanese Patent Application No. 2001-292041, filed on Sep. 25, 2001, is hereby incorporated by reference in its entirety.

BACKGROUND OF THE INVENTION

The present invention relates to a mask and its manufacturing method, an electro-luminescence device and its manufacturing method, and an electronic instrument.

A mask with high precision is required. For example, a method of manufacturing a color organic electro-luminescence (EL) device that is known uses a mask to deposit an organic material of each color. Since deposition is performed under the high temperature, it is preferable to cool the mask. In a conventional method, a component for holding the mask is cooled, but it is desirable to further improve the cooling efficiency.

BRIEF SUMMARY OF THE INVENTION

According to a first aspect of the present invention, there is provided a method of manufacturing a mask comprising:

attaching to a first substrate having an opening a second substrate having a plurality of penetrating holes such that the penetrating holes are positioned within the opening;

forming a groove on at least one of a surface of the first substrate facing the second substrate and a surface of the second substrate facing the first substrate; and utilizing the groove to form a flow path between the first and second substrates.

According to a second aspect of the present invention, there is provided a mask comprising:

a first substrate having an opening; and a second substrate attached to the first substrate and having a plurality of penetrating holes, wherein:

the second substrate is attached to the first substrate such that the penetrating holes are positioned within the opening;

a groove is formed on at least one of a surface of the first substrate facing the second substrate and a surface of the second substrate facing the first substrate; and the groove is utilized to form a flow path between the first and second substrates.

A method of manufacturing an EL device according to a third aspect of the present invention comprising:

forming a film of a light emitting material using the mask as defined in claim 9; and cooling the mask by causing a fluid to flow through the flow path of the mask, in the step of forming a film of a light emitting material.

An EL device according to a fourth aspect of the present invention is manufactured by the above method.

An electronic instrument according to a fifth aspect of the present invention has the above EL device.

DETAILED DESCRIPTION OF THE EMBODIMENTS

Figure 1A:
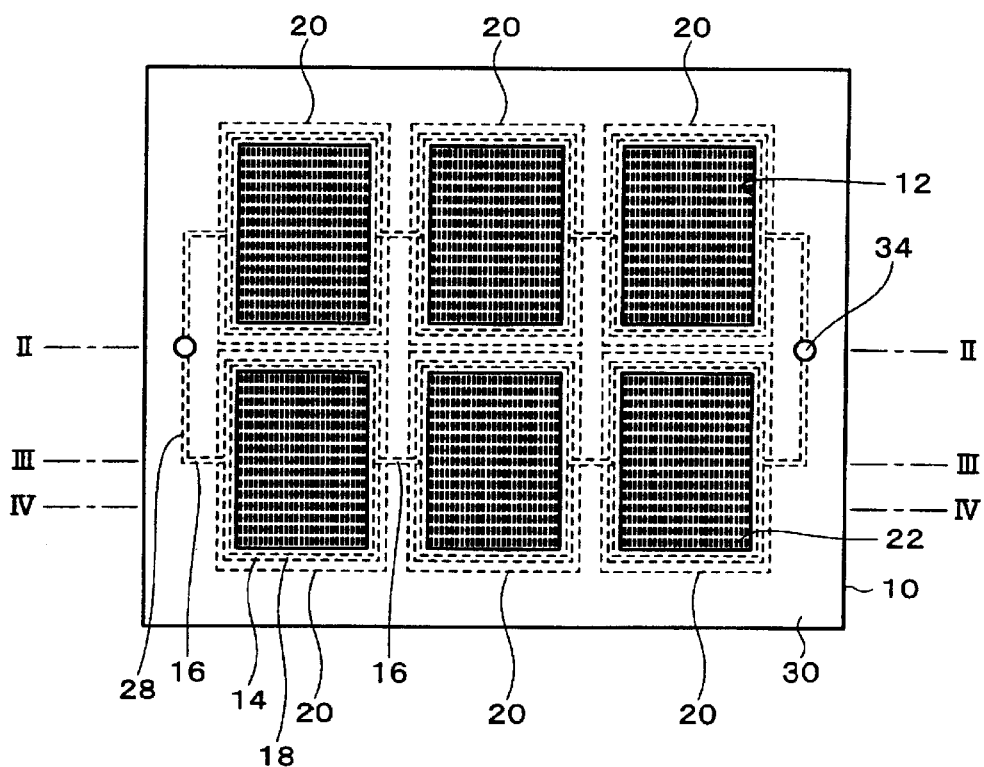
FIGS. 1A and 1B are views illustrative of a mask according to one embodiment of the present invention.

Embodiments of the present invention may provide a mask which can be effectively cooled and its manufacturing method, an EL device and its manufacturing method, and an electronic instrument.

(1) According to one embodiment of the present invention, there is provided a method of manufacturing a mask comprising:

attaching to a first substrate having an opening a second substrate having a plurality of penetrating holes such that the penetrating holes are positioned within the opening;

forming a groove on at least one of a surface of the first substrate facing the second substrate and a surface of the second substrate facing the first substrate; and utilizing the groove to form a flow path between the first and second substrates.

According to this embodiment, the flow path can be simply formed in the mask. The cooling efficiency of the mask is high since the fluid flowing through this flow path comes in contact with the second substrate.

(2) In this method of manufacturing a mask, at least part of the groove may be formed around the opening.

(3) In this method of manufacturing a mask, the first and second substrates may be joined by anode coupling.

The anode coupling is a method of generating electrostatic force in a joining interface by voltage application to cause chemical bonding in the joining interface.

(4) In this method of manufacturing a mask, the steps of forming the second substrate may include:

forming the penetrating holes in a silicon wafer; and cutting the silicon wafer into a shape corresponding to the second substrate.

(5) The method of manufacturing a mask may further comprise:

forming a magnetic film over the second substrate.

This makes it possible to manufacture a mask which can be attracted by magnetic force.

(6) In this method of manufacturing a mask, a plurality of the second substrates may be attached to the first substrate;

the first substrate may have a plurality of the openings; and each of the second substrates may be attached to corresponding one of the openings.

This makes it possible to form a large-sized mask (in which a plurality of masks are integrated) can be manufactured.

(7) The method of manufacturing a mask may further comprise:

polishing surfaces of the second substrates attached to the first substrate to have a uniform height.

Since the surfaces of the second substrate are flattened, adhesion with an object to which deposition or the like is performed can be improved.

(8) According to one embodiment of the present invention, there is provided a mask comprising:

a first substrate having an opening; and a second substrate attached to the first substrate and having a plurality of penetrating holes, wherein:

the second substrate is attached to the first substrate such that the penetrating holes are positioned within the opening;

a groove is formed on at least one of a surface of the first substrate facing the second substrate and a surface of the second substrate facing the first substrate; and the groove is utilized to form a flow path between the first and second substrates.

In accordance with this embodiment, part of the surface of the second substrate is part of the flow path. Accordingly, since the fluid comes in contact with the second substrate, the cooling efficiency of the mask can be improved.

(9) In this mask, at least part of the groove maybe formed around the opening.

(10) In this mask, the first and second substrates may be joined by anode coupling.

The anode coupling is a method of generating electrostatic force in a joining interface by voltage application to cause chemical bonding in the joining interface.

(11) In this mask, a magnetic film may be formed over the second substrate.

This makes it possible to attract the second substrate by magnetic force.

(12) In this mask, a plurality of the openings may be formed in the first substrate;

a plurality of the second substrates may be attached to the first substrate; and each of the second substrates may be attached to corresponding one of the openings.

This mask is large-sized by integrating a plurality of masks.

(13) In this mask, surfaces of the second substrates attached to the first substrate maybe polished to have a uniform height.

Since the surfaces of the second substrates are flattened, adhesion with an object to which deposition or the like is performed can be improved.

(14) According to one embodiment of the present invention, there is provided a method of manufacturing an EL device comprising:

forming a film of a light emitting material using the above-described mask; and cooling the mask by causing a fluid to flow through the flow path of the mask, in the step of forming a film of a light emitting material.

(15) An EL device in accordance with one embodiment of the present invention is manufactured by the above method.

(16) An electronic instrument according to one embodiment of the present invention has the above EL device.

Embodiment of the present invention will be described below with reference to the drawings.

Figure 1B:
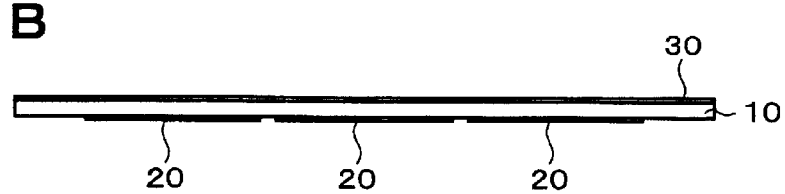
Figure 2:
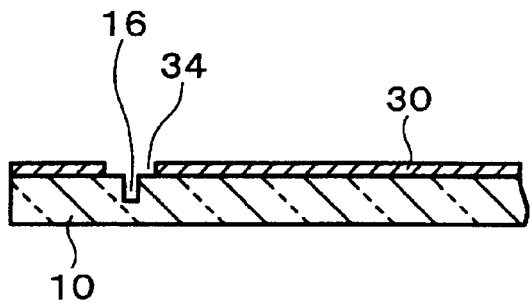
FIG. 2 is a partially enlarged sectional view taken along the II—II line of FIG. 1A.
Figure 3:
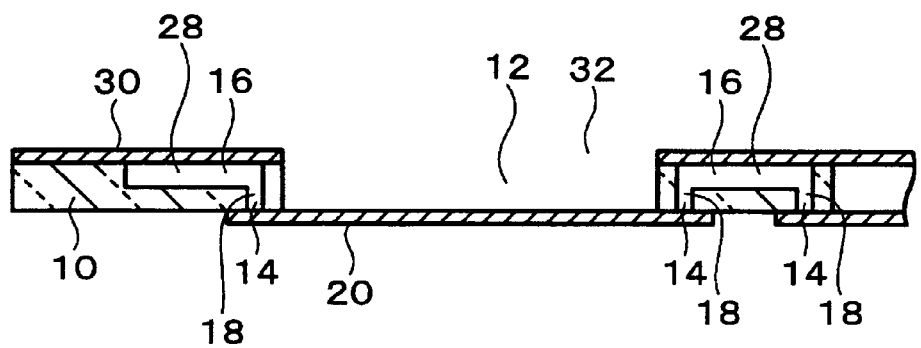
FIG. 3 is a partially enlarged sectional view taken along the III—III line of FIG. 1A.
Figure 4:
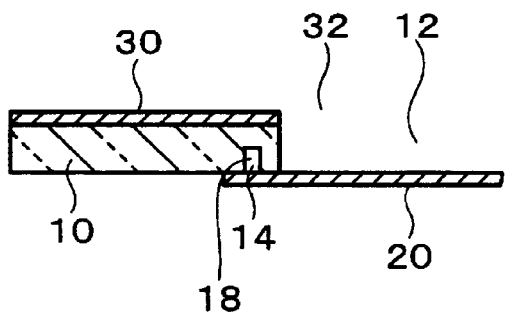
FIG. 4 is a partially enlarged sectional view taken along the IV—IV line of FIG. 1A.
Figure 5:
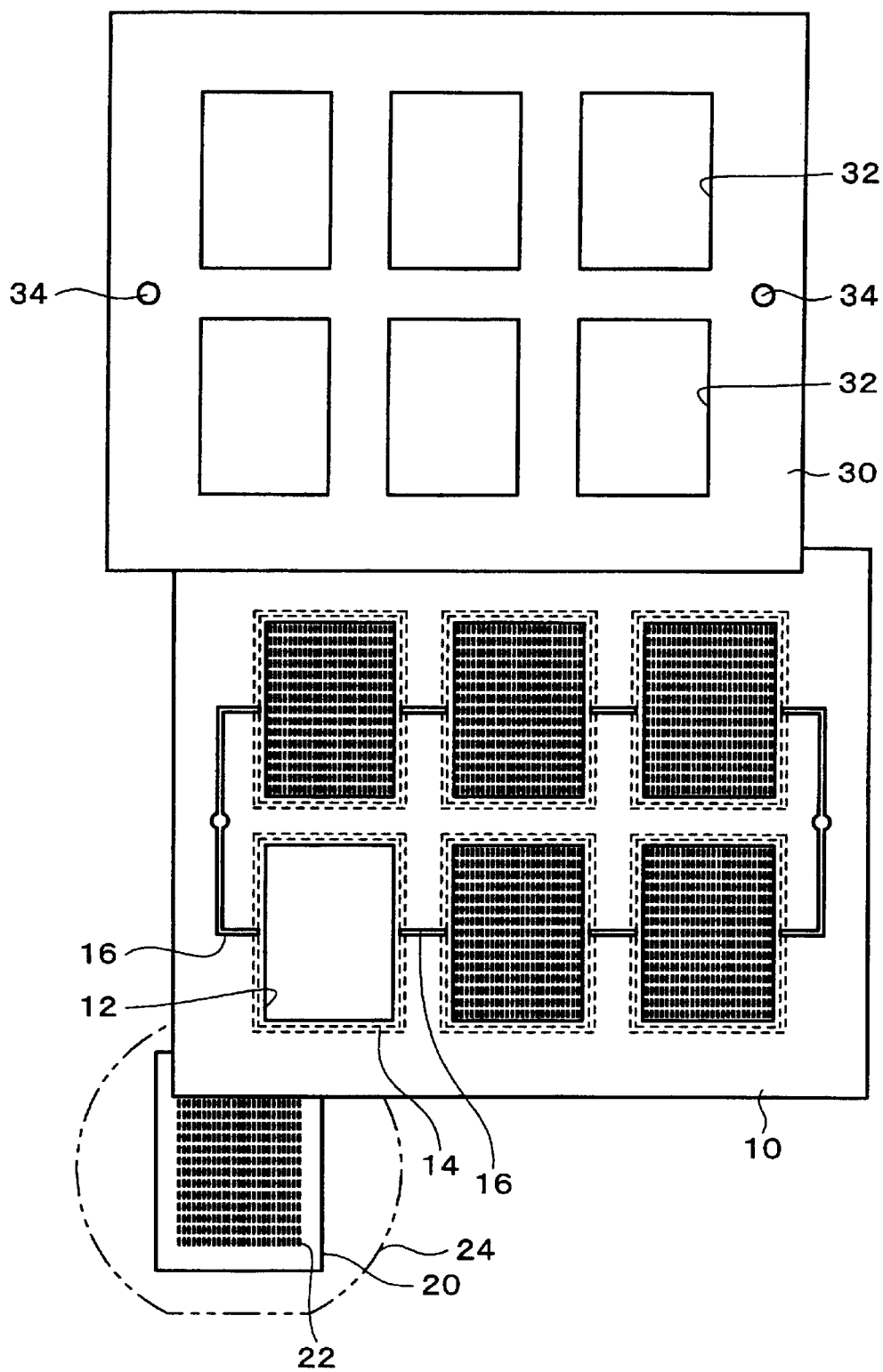
FIG. 5 is an exploded view of a mask in accordance with one embodiment of the present invention.

FIGS. 1A and 1B are views for describing a mask in accordance with one embodiment of the present invention. FIG. 1A is a plan view of the mask, and FIG. 1B is a side view of the mask. FIG. 2 is a partially enlarged sectional view taken along the II—II line of FIG. 1A. FIG. 3 is a partially enlarged sectional view taken along the III—III line of FIG. 1A. FIG. 4 is a partially enlarged sectional view taken along the IV—IV line of FIG. 1A. FIG. 5 is an exploded view of the mask.

The mask has a first substrate 10 and at least one (plural in the example shown in FIG. 1A) second substrate 20. The first substrate 10 may be set to a transparent substrate. In this embodiment, the first substrate 10 is constructed by a material (e.g., borosilicate glass) able to be anode-joined to the second substrate 20. At least one (plural in the example shown in FIG. 1A) opening 12 is formed in the first substrate 10. It can be the that the first substrate 10 is a frame. The opening 12 is smaller than the second substrate 20. However, the opening 12 is greater than a forming area of plural penetrating holes 22 in the second substrate 20. The opening 12 may be formed in a rectangular shape.

The second substrate 20 may be also formed in a rectangular shape. The plural penetrating holes 22 are formed in the second substrate 20. The shape of the penetrating hole 22 may be set to any one of a square shape, a parallelogram shape and a circular shape. A mask pattern is constructed by the shape, arrangement and number of penetrating holes 22. It can be the that the second substrate 20 is a screen plate.

The second substrate 20 is attached to the first substrate 10. As shown in FIG. 1A, the second substrate 20 is attached such that the plural penetrating holes 22 are arranged inside the opening 12. An end portion of the second substrate 20 is attached to an end portion of the opening 12 of the first substrate 10. More particularly, an entire peripheral portion (or a rectangular edge portion) of the second substrate 20 is attached to an entire peripheral portion (or a rectangular edge portion) of the opening of the first substrate 10. One second substrate 20 is arranged in accordance with one opening 12. In this embodiment, the first substrate 10 and the second substrate 20 are anode-joined. The second substrate 20 is constructed by a material (e.g., silicon) able to be anode-joined to the first substrate 10.

A groove 14 (see FIGS. 3 and 4) is formed in the first substrate 10. The groove 14 is formed on a surface of the first substrate 10 facing the second substrate 20. The groove 14 may be also formed around the opening 12. Specifically, the groove 14 may be formed in a ring shape or a rectangular shape. For example, plural discontinuous grooves 14 may be also formed in accordance with the plural openings 12. In this case, the individual second substrate 20 may be attached to each of the grooves 14. The groove 14 may be also formed only within an attaching area of the second substrate 20 in the first substrate 10. In this case, a flow path 18 is formed by the groove 14 and the second substrate 20.

A groove 16 is formed on a surface of the first substrate 10 which is opposite to the other surface facing the second substrate 20. Namely, the first substrate 10 has the groove 14 on one surface, and the groove 16 on the other surface. As shown in FIG. 3, the grooves 14, 16 are partially communicated with each other. The plural discontinuous grooves 14 can be communicated through the groove 16.

A third substrate 30 is attached to the first substrate 10. At least one (e.g., plural) penetrating hole 34 is formed in the third substrate 30. The penetrating hole 34 is arranged above part of the groove 16. The third substrate 30 is arranged so as to cover the groove 16 except that the penetrating hole 34 is formed. The groove 16 may be also covered with one third substrate 30. A flow path 28 is formed by the groove 16 and the third substrate 30. The penetrating hole 34 becomes an inlet and an outlet with respect to the flow path 28. The plural penetrating holes 34 are formed and one of these penetrating holes 34 is set to the inlet to the flow path 28, and another of these penetrating holes 34 may be set to the outlet from the flow path 28. The third substrate 30 has a shape in which no opening 12 of the first substrate 10 is covered. For example, an opening 32 is formed in the third substrate 30.

In accordance with the mask in this embodiment, the flow path 18 is formed by the groove 14 and the second substrate 20. Since the second substrate 20 itself is part of the flow path 18, the second substrate 20 can be effectively cooled when a cooled fluid flows through the flow path 18. Even when the discontinuous flow path 18 is formed in accordance with each of the plural discontinuous grooves 14, the discontinuous flow path 18 can be communicated by the flow path 28. The flow path 28 is formed by the groove 16 and the third substrate 30. The fluid can be flowed from the penetrating hole 34 of the third substrate 30 to the flow path 28.

The manufacturing method of the mask in accordance with the embodiment of the present invention will next be described. In this embodiment, the first substrate 10 and the second substrate 20 are prepared. Sandblast may be applied to the formation of the opening 12 in the first substrate 10.

Plural penetrating holes 22 are formed in the second substrate 20. Etching (e.g., anisotropic etching with a crystal orientation dependence) may be applied to this formation. The wall surface of the penetrating hole 22 may be set to be perpendicular to the surface of the second substrate 20, and may be also tapered. As shown in FIG. 5, the second substrate 20 may be formed from a silicon wafer 24. In this case, the silicon wafer 24 may be cut in accordance with the second substrate 20.

Figure 6:
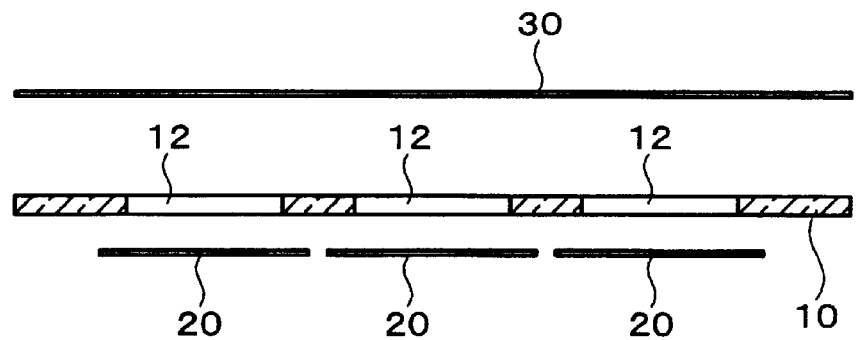
FIG. 6 is a view for describing a manufacturing method of a mask according to one embodiment of the present invention.

The first substrate 10 and the second substrate 20 are placed as shown in FIG. 6. The plural second substrates 20 are arranged so as not to be overlapped with each other. The plural second substrates 20 are arranged on one side of the first substrate 10. Then the second substrates 20 are attached to the first substrate 10. The first substrate 10 and the third substrate 30 are positioned. The third substrate is attached to the first substrate 10. The positioning and attachment of the first substrate 10 and the second substrate 20, and the positioning and attachment of the first substrate 10 and the third substrate 30 may be performed sequentially, or simultaneously.

Figure 7:
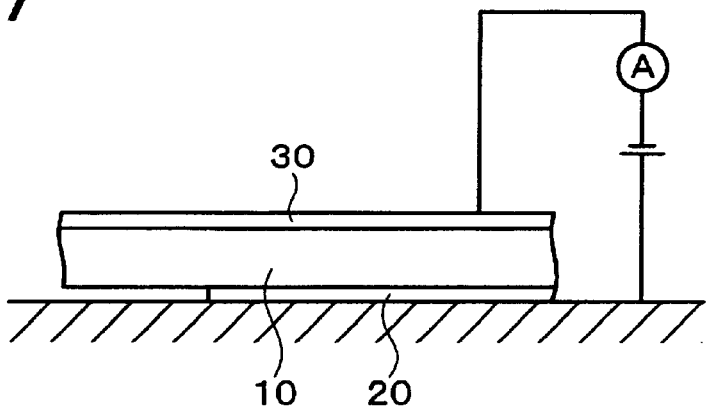
FIG. 7 is a view for describing a manufacturing method of a mask according to one embodiment of the present invention.

FIG. 7 shows an example of the method of attaching the first substrate 10 and the second substrate 20. In this embodiment, the anode coupling is applied. More particularly, The first substrate 10 and the second substrate 20 are placed such that the surfaces to be attached face each other, and are heated to about 300 to 500° C., and then a voltage of about 500 V is applied. When the first substrate 10 is formed of borosilicate glass (e.g., Corning#7740 (Pyrex® glass)) and the second substrate 20 is formed of silicon, the first substrate 10 is connected to the negative pole. Thus, a plus ion (sodium ion) of the first substrate 10 is moved toward the minus, and the surface of the first substrate 10 facing the second substrate 20 is charged to the negative pole. On the other hand, the surface of the second substrate 20 facing the first substrate 10 is charged to the plus. Thus, the first substrate 10 and the second substrate 20 are attracted to each other by electrostatic force, and chemical bonding is caused so that the first substrate 10 and the second substrate 20 are joined to each other.

The coefficient of thermal expansion of the Corning #7740 (Pyrex® glass) constituting the first substrate 10 is about 3.5 ppm/° C., and is close to the coefficient of thermal expansion of silicon constituting the second substrate 20. Accordingly, even when the mask is used under high temperature, a warp and a strain are small so that the warp and the strain can be neglected. Since no adhesive is used in accordance with the anode coupling, there is no strain due to hardening contraction and no gas is emitted. Thus, the mask in accordance with this embodiment is optimal for evaporation in a high vacuum.

The attaching method of the above first substrate 10 and the above second substrate 20 may be also applied to the attachment of the first substrate 10 and the third substrate 30. In accordance with this embodiment, the flow path 18 is formed by the groove 14 and the second substrate 20. The second substrate 20 forms part of the flow path 18. Since the second substrate 20 is reinforced by the first substrate 10, a mask having large strength can be manufactured.

The present invention does not exclude the joining using the adhesive. For example, the first substrate 10 and the second substrate 20, or the first substrate 10 and the third substrate 30 may be also adhered by the adhesive. The adhesive 30 may be set to an energy hardening adhesive. The energy includes light (an ultraviolet ray, an infrared ray and visible light), radiation such as an X-ray, etc. and heat.

Figure 8:
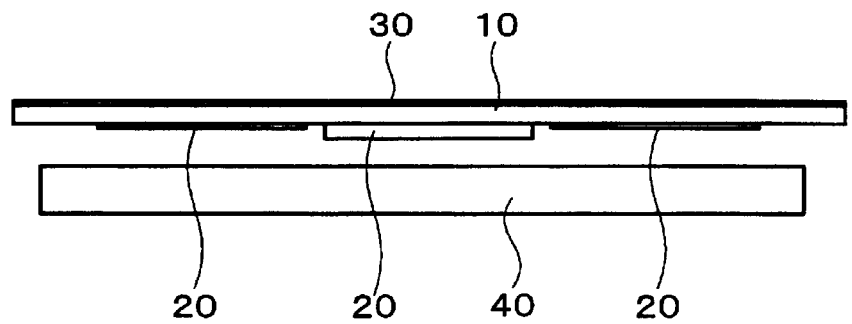
FIG. 8 is a view for describing a manufacturing method of a mask according to one embodiment of the present invention.

As shown in FIG. 8, when the plural second substrates 20 are not uniformed in height because the plural second substrates 20 are dispersed in thickness, etc., the surfaces of the second substrates 20 may be polished by a grindstone 40, etc. In accordance with this configuration, since the surfaces of the plural second substrates 20 are flattened, it is possible to raise close attaching property to an object to be evaporated, etc.

Figure 9A:
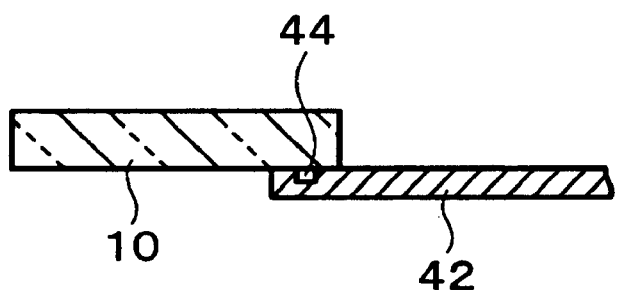
FIGS. 9A and 9B show a modification of one embodiment of the present invention.
Figure 9B:
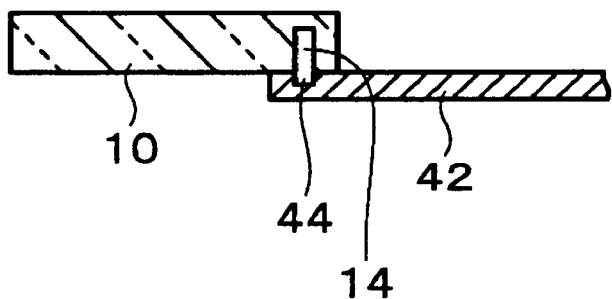

FIGS. 9A and 9B are views showing a modification of one embodiment of the present invention. Although the groove 14 is formed in the first substrate 10 in the above embodiment, a groove 44 may be formed in a second substrate 42, as shown in FIG. 9A. Alternatively, the groove 14 may be formed in the first substrate 10, the groove 44 in the second substrate 42, to face each other and form a flow path, as shown in FIG. 9B.

Figure 10:
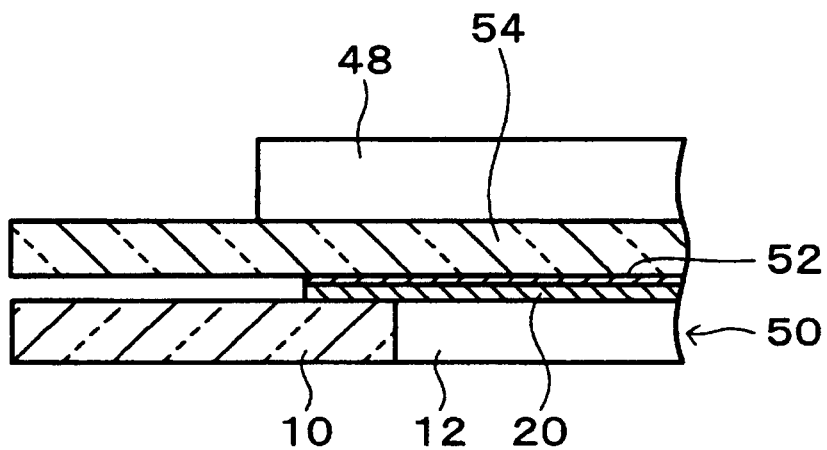
FIG. 10 is a view for describing the manufacturing method of a mask and an EL device in accordance with one embodiment of the present invention.

FIG. 10 is a view for describing the manufacturing method of a mask and an EL device in accordance with one embodiment of the present invention. A magnetic film 52 is formed in a mask 50 (e.g., second substrate 20) shown in FIG. 10. The magnetic film 52 can be formed by a ferromagnetic material such as iron, cobalt, nickel, etc. Otherwise, the magnetic film 52 may be also formed by a magnetic metal material such as Ni, Co, Fe, a stainless steel alloy including an Fe component, etc., the bonding of the magnetic metal material and a nonmagnetic metal material.

Figure 11A:
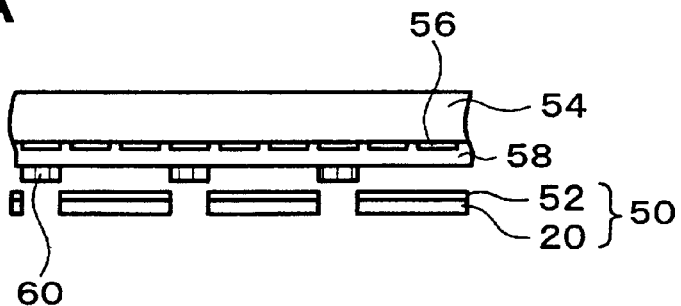
FIGS. 11A to 11C are views for describing a method of forming a film of a light emitting material.

In this embodiment, the light emitting material is formed as a film in the substrate 54 by using the mask 50. The substrate 54 is arranged to form plural EL devices (e.g., organic EL devices) and is a transparent substrate such as a glass substrate, etc. As shown in FIG. 11A, an electrode (e.g., a transparent electrode constructed by ITO, etc.) 56 and a positive hole transport layer 58 are formed in the substrate 54. An electronic transport layer may be also formed.

As shown in FIG. 10, the mask 50 is arranged such that the second substrate 20 is located on the substrate 54 side. A magnet 48 is arranged behind the substrate 54 so as to attract the magnetic film 52 formed in the mask 50 (second substrate 20). Thus, even when a warp is caused in the mask 50 (second substrate 20), this warp can be corrected.

Figure 11B:
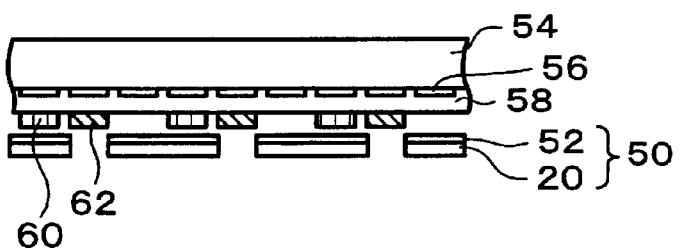
Figure 11C:
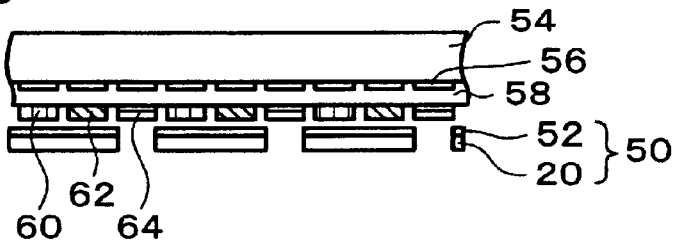

FIGS. 11A to 11C are views for describing a method of forming a film of a light emitting material. For example, the light emitting material is an organic material, and there is alumiquinolinol complex ($Alq_3$) as the organic material of low molecule, and there is poly(p-phenylenevinylene) (PPV) as the organic material of high molecule. The film of the light emitting material can be formed by evaporation. For example, as shown in FIG. 11A, while a red light emitting material is patterned through the mask 50, the film is formed and a red light emitting layer 60 is formed. As shown in FIG. 11B, while the mask 50 is shifted and a green light emitting material is patterned, the film is formed and a green light emitting layer 62 is formed. As shown in FIG. 11C, while the mask 50 is again shifted and a blue light emitting material is patterned, the film is formed and a blue light emitting layer 62 is formed.

In this embodiment, the above flow path 18 is formed in the mask 50. The film of the light emitting material is formed while a cooled fluid flows through the flow path 18. Thus, the mask 50 can be effectively cooled. In this embodiment, the second substrate 20 as a screen is reinforced by the first substrate 10. Accordingly, the warp and the flexure of the second substrate 20 are not caused, and the reproducibility of selective evaporation is high and productivity is high. In this embodiment, plural openings 12 are formed in the first substrate 10 in the mask 50, and the second substrate 20 is located in accordance with each of the openings 12. Each second substrate 20 corresponds to one EL device. Namely, the integrated plural EL devices can be manufactured by using the mask 50. The individual EL device can be obtained by cutting the substrate 54.

Figure 12:
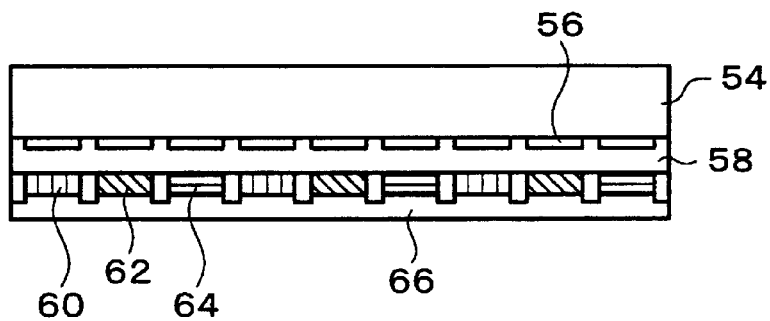
FIG. 12 is a view showing an EL device manufactured by utilizing the method of forming a film of a light emitting material using a mask in accordance with one embodiment of the present invention.

FIG. 12 is a view showing an EL device manufactured by utilizing the above method of forming a film of a light emitting material. The EL device (e.g., organic EL device) has a substrate 54, an electrode 56, a positive hole transport layer 58, light emitting layers 60, 62, 64, etc. An electrode 66 is formed on the light emitting layers 60, 62, 64. For example, the electrode 66 is a cathode electrode. The EL device (EL panel) becomes a display device (display).

Figure 13:
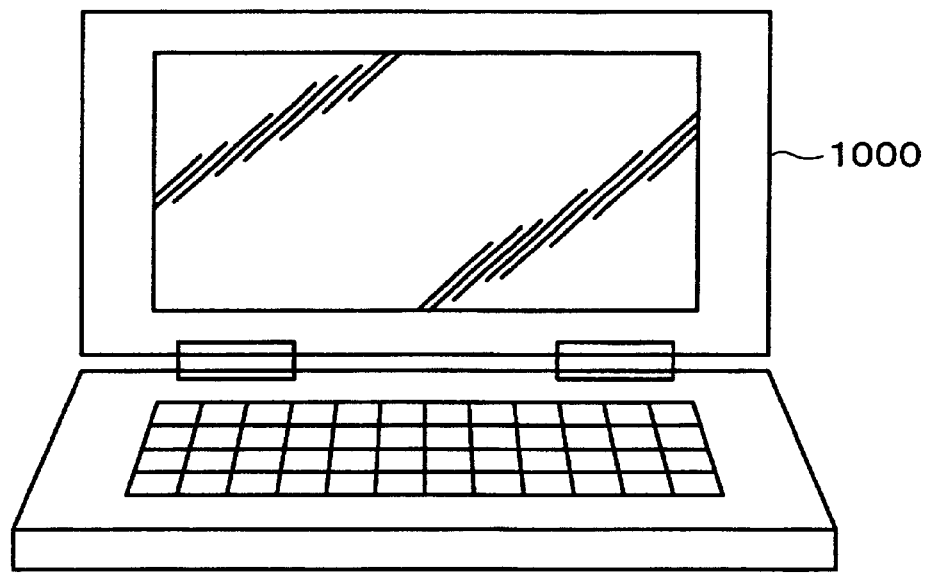
FIG. 13 is a view showing an electronic instrument in accordance with one embodiment of the present invention.
Figure 14:
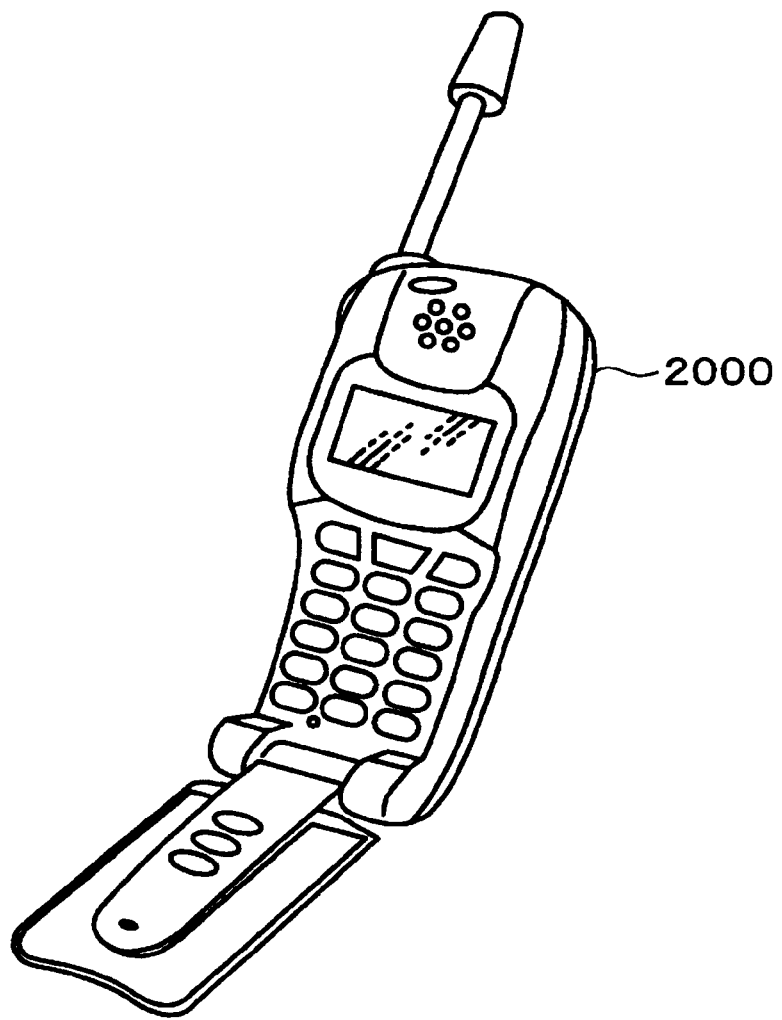
FIG. 14 is a view showing an electronic instrument in accordance with one embodiment of the present invention.

A notebook personal computer 1000 is shown in FIG. 13 and a portable telephone 2000 is shown in FIG. 14 as an electronic instrument having an EL device in accordance with one embodiment of the present invention.

The present invention is not limited to the above-described embodiments, and various modifications can be made. For example, the present invention includes various other configurations substantially the same as the configurations described in the embodiments (in function, method and effect, or in objective and effect, for example). The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations in the embodiments.

What is claimed is:

1. A method of manufacturing a mask comprising:
   attaching to a first substrate having an opening a second substrate having a plurality of penetrating holes such that substantially all the penetrating holes are positioned within the opening;
   forming a groove on at least one of a surface of the first substrate facing the second substrate and a surface of the second substrate facing the first substrate; and
   utilizing the groove to form a flow path between the first and second substrates.

2. The manufacturing method of the mask as defined in claim 1,
   wherein at least part of the groove is formed around the opening.

3. The manufacturing method of the mask as defined in claim 1,
   wherein the first and second substrates are joined by anode coupling.

4. The manufacturing method of the mask as defined in claim 2,
   wherein the first and second substrates are joined by anode coupling.

5. The manufacturing method of the mask as defined in claim 1,
   wherein the steps of forming the second substrate includes:
      forming the penetrating holes in a silicon wafer; and
      cutting the silicon wafer into a shape corresponding to the second substrate.

6. The manufacturing method of the mask as defined in claim 1, further comprising:
   forming a magnetic film over the second substrate.

7. The manufacturing method of the mask as defined in claim 1, wherein:
   a plurality of the second substrates are attached to the first substrate;
   the first substrate has a plurality of the openings; and
   each of the second substrates is attached to corresponding one of the openings.

8. The manufacturing method of the mask as defined in claim 7, further comprising
   polishing surfaces of the second substrates attached to the first substrate to have a uniform height.

9. A mask comprising:
   a first substrate having an opening; and
   a second substrate attached to the first substrate and having a plurality of penetrating holes, wherein:
      the second substrate is attached to the first substrate such that substantially all the penetrating holes are positioned within the opening;
      a groove is formed on at least one of a surface of the first substrate facing the second substrate and a surface of the second substrate facing the first substrate; and
      the groove is utilized to form a flow path between the first and second substrates.

10. The mask as defined in claim 9,
    wherein at least part of the groove is formed around the opening.

11. The mask as defined in claim 9,
wherein the first and second substrates are joined by anode coupling.

12. The mask as defined in claim 10,
wherein the first and second substrates are joined by anode coupling.

13. The mask as defined in claim 9,
wherein a magnetic film is formed over the second substrate.

14. The mask as defined in claim 9, wherein:
a plurality of the openings are formed in the first substrate;
a plurality of the second substrates are attached to the first substrate; and
each of the second substrates is attached to corresponding one of the openings.

15. The mask as defined in claim 14,
wherein surfaces of the second substrates attached to the first substrate are polished to have a uniform height.

16. A method of manufacturing an electro-luminescence device comprising:
forming a film of a light emitting material using the mask as defined in claim 9; and
cooling the mask by causing a fluid to flow through the flow path of the mask, in the step of forming a film of a light emitting material.

17. A method of manufacturing an electro-luminescence device comprising:
forming a film of a light emitting material using the mask as defined in claim 10; and
cooling the mask by causing a fluid to flow through the flow path of the mask, in the step of forming a film of a light emitting material.

18. A method of manufacturing an electro-luminescence device comprising:
forming a film of a light emitting material using the mask as defined in claim 11; and
cooling the mask by causing a fluid to flow through the flow path of the mask, in the step of forming a film of a light emitting material.

19. A method of manufacturing an electro-luminescence device comprising:
forming a film of a light emitting material using the mask as defined in claim 12; and
cooling the mask by causing a fluid to flow through the flow path of the mask, in the step of forming a film of a light emitting material.

* * * * *